United States Patent [19]

Kuramoto

[11] 4,316,142
[45] Feb. 16, 1982

[54] CLAMP TYPE AMMETER

[75] Inventor: Takeo Kuramoto, Tokyo, Japan

[73] Assignee: Kyoritsu Electrical Instruments Works, Ltd., Tokyo, Japan

[21] Appl. No.: 149,340

[22] Filed: May 13, 1980

[30] Foreign Application Priority Data

Nov. 20, 1979 [JP] Japan .................................. 54-159892

[51] Int. Cl.³ .......................... G01R 1/22; H01F 17/06
[52] U.S. Cl. ..................................... 324/127; 336/176
[58] Field of Search ............... 324/127, 117 R, 117 H, 324/129, 149; 336/176

[56] References Cited

FOREIGN PATENT DOCUMENTS 2298110 9/1976 France ................................. 324/127
327837 4/1930 United Kingdom ............... 324/127

*Primary Examiner*—Ernest F. Karlsen
*Attorney, Agent, or Firm*—Kurt Kelman

[57] ABSTRACT

A center-opening clamp type ammeter provided with a pair of magnetic cores each having actuating means provided on the basal portion thereof and constructed so that the opening operation of one of the magnetic cores causes the other magnetic core to be opened and that when the opening operation is freed the magnetic cores are brought into a closed state.

3 Claims, 5 Drawing Figures

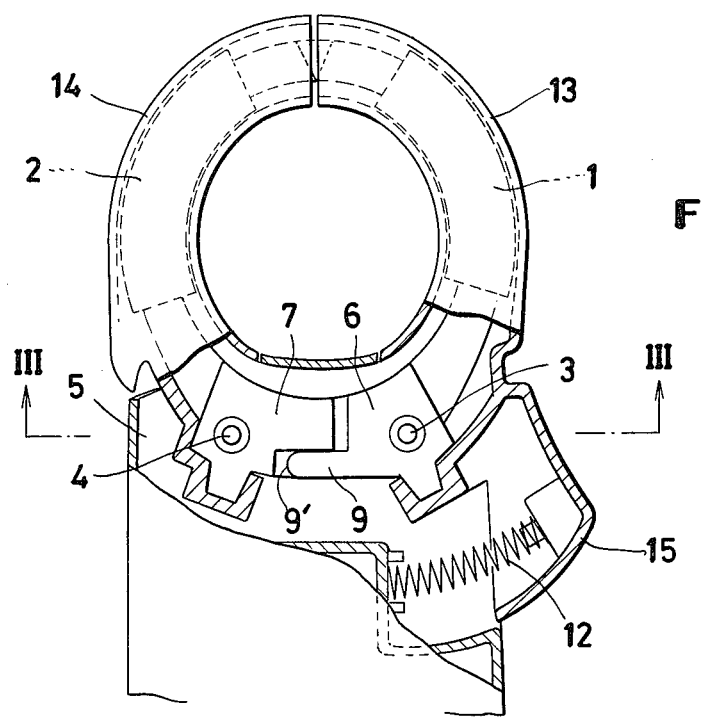
Fig_1
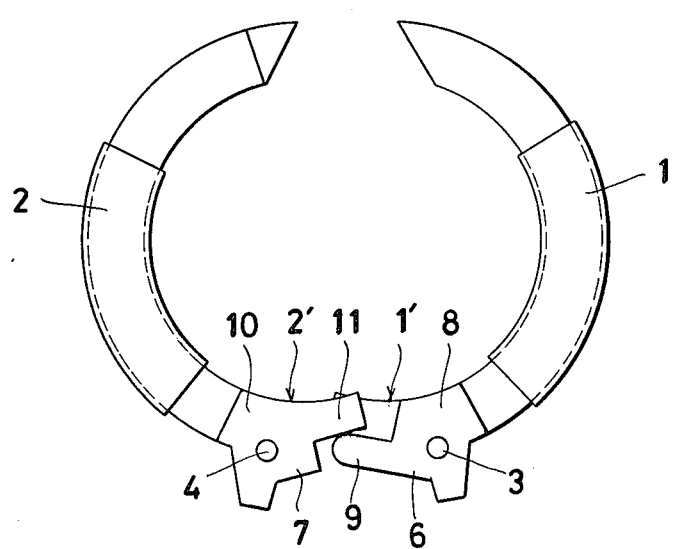
Fig_2

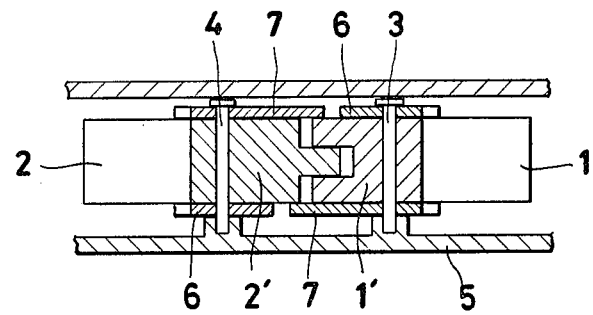
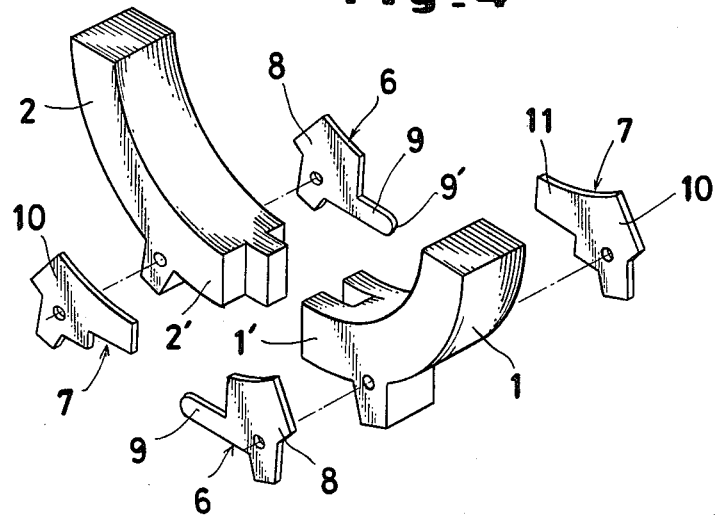
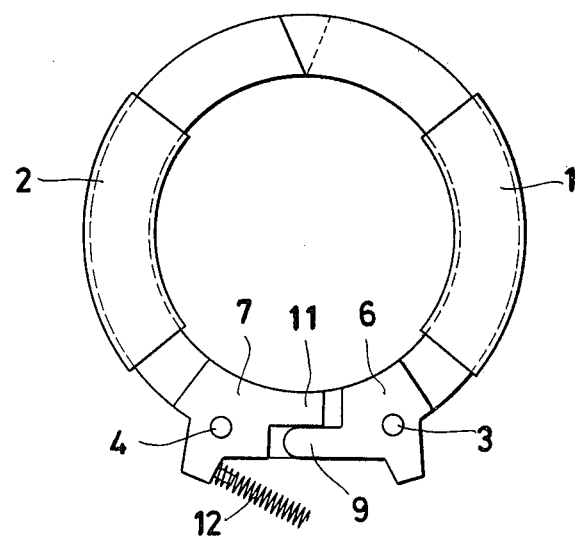

CLAMP TYPE AMMETER

BACKGROUND OF THE INVENTION

This invention relates to a clamp type ammeter, and more particularly to the mechanism for opening and closing a pair of opposed magnetic cores in a center-opening clamp type ammeter.

The conventional center-opening clamp type ammeter incorporates the pair of magnetic cores adapted to open in both directions and to admit a free increase to the aperture therebetween and, therefore, enjoys an advantage that it clamps a given electric cable with great ease. Since the pair of magnetic cores are interlocked to each other so as to be synchronously opened and closed to a desired aperture, however, the mechanism serving to open and close these magnetic cores is complicated and admits little reduction in size.

For example, Japanese Patent Publication Sho. 54 (1979)-32350 discloses an invention aimed at synchronizing such a pair of magnetic cores by means of a link mechanism. This invention necessitates inclusion of a space for accommodating this link mechanism in the portion at which the magnetic cores are fastened to the ammeter proper. Japanese Utility Model Laid-open Publication Sho. 53 (1978)-56884 discloses an invention which accomplishes the synchronization of movements of a pair of magnetic cores by causing the terminal portions of a pair of magnetic cores rotatably attached through the medium of a bearing shaft to the ammeter proper to be shaped so as to rest one on top of the other, boring a slender hole through the overlapping point of the terminal portions and piercing a connecting pin through the slender hole, whereby a motion imparted to one of the two magnetic cores automatically causes the remaining magnetic core to be synchronously moved.

For center-opening clamp type ammeters of the class described above, it is important that the opening and closing operations proceed smoothly, the individual magnetic cores forming the pair should come into safe, intimate contact with each other in their completely closed state, and the mechanism used for opening and closing the magnetic cores should be simple enough to admit considerable reduction in size. For the ammeters to function perfectly on electric cables of large diameters, it is equally important that the mechanism should be provided with a special device capable of precluding the occurrence of play when the magnetic cores are in their fully opened state.

SUMMARY OF THE INVENTION

This invention originated from an understanding of the problems mentioned above. One object of this invention is to provide a clamp type ammeter so constructed that the two opposed magnetic cores are effectively opened safely by means of a simple mechanism and they produce no play even when they are brought into a fully opened state.

To accomplish the object described above according to the present invention, there is provided a clamp type ammeter which comprises one laterally symmetrical pair of magnetic cores each pivotally attached to a support shaft, first actuating means possessing an actuating piece and attached to the basal portion pivotally attached to one of the magnetic cores and second actuating means possessing a receiving piece and attached to the basal portion pivotally attached to the other magnetic core, the first actuating means and the second actuating means being disposed so as to have the receiving piece underlaid by the actuating piece, and means adapted to keep the pair of magnetic cores normally in a closed state. When trigger means is operated to rotate the magnetic core holding fast thereon the first actuating means in the direction of opening, the actuating piece of the first actuating means pushes up the receiving piece of the second actuating means and the other magnetic core is simultaneously rotated in the direction of opening.

As described above, the present invention simply comprises actuating means provided at basal portions of the respective magnetic cores and adapted to synchronize the movements of the pair of magnetic cores so that when one of the magnetic cores is rotated in the direction of opening, the other magnetic core is smoothly rotated similarly in the direction of opening, and spring means adapted to keep the magnetic cores normally in an energized condition. The ammeter of the present invention requires no special space for accommodating such actuating means. Furthermore, since the actuating means are so adapted as to keep the magnetic cores sandwiched fast therebetween, the magnetic cores are prevented from producing play relative to each other even when they are brought into a fully opened state.

The other objects and characteristics of this invention will become apparent from the further disclosure of the invention to be made hereinafter with reference to the accompanying drawing.

BRIEF EXPLANATION OF THE DRAWING

FIG. 1 is a partially cutaway front view of one embodiment of the clamp type ammeter according to the present invention.

FIG. 2 is a front view illustrating the magnetic cores of the ammeter of FIG. 1 in an opened state.

FIG. 3 is a cross section taken along the line III—III of FIG. 1.

FIG. 4 is an exploded perspective view of the essential part of the mechanism for opening and closing the magnetic cores of the ammeter of FIG. 1.

FIG. 5 is an explanatory diagram illustrating another embodiment of the clamp ammeter according to the present invention.

DESCRIPTION OF PREFERRED EMBODIMENTS

The clamp type ammeter of the present invention will be described with reference to the illustrated embodiments. A laterally symmetrical pair of magnetic cores 1, 2 encased in plastic covers 13, 14 have their basal portions 1', 2' rotatably attached through the medium of pivots to support shafts 3, 4. The support shafts 3, 4 are implanted in a base plate (ammeter body) 5. The aforementioned basal portions 1', 2' are each provided on one or both of the opposite sides thereof with first actuating means (plate) 6 and second actuating means (plate) 7 suitably as by, for example, riveting, screwing or welding. In the first illustrated embodiment, the first actuating means 6 and the second actuating means 7 are attached each on one side to the basal portions 1', 2' and the second actuating means 6 and the first actuating means 6 are attached each on the other side to the basal portions respectively. The first actuating means 6 possesses a fitting portion 8 adapted to fasten the actuating means to the basal portion of the magnetic core 1 and an actuating piece 9 extending from one lower lateral part of the aforementioned fitting portion 8 and terminating in a semicircular tip 9'. The second actuating means 7 possesses a fitting portion 10 adapted to fasten the actuating means to the basal portion of the magnetic core 2 and a receiving piece 11 protruding from one upper lateral part of the aforementioned fitting portion 10. These actuating means are formed of a material such as steel which is tough and resistant to wear. Optionally, the basal portions of the magnetic cores may be formed in shapes as though they incorporated the respective actuating means.

As regards the manner in which the aforementioned first actuating means 6 and the second actuating means 7 are set in position, when the fitting portion 8 is secured to the surface of the basal portion 1' and the fitting portion 10 to the surface of the basal portion 2' respectively, the actuating piece 9 occupies a position below the receiving piece 11 and the lower edge of the receiving piece 11 and the upper edge of the actuating piece 9 either come into contact or approach each other.

The first actuating means 6 and the second actuating means 7 are attached respectively to the basal portions 1, 2 each on one side thereof as described above, then the second actuating means 7 and the first actuating means 6 are attached respectively to the basal portions 1', 2' each on the other side, and the magnetic cores are energized at all times so as to be retained in a closed state by means of a spring 12.

In the construction described above, when a trigger 15 is depressed with a finger tip inwardly in the direction of squeezing the spring 12, the magnetic core 1 rotates about the support shaft 3 and the actuating piece 9 of the first actuating means 6 pushes up the receiving piece 11 of the second actuating means 7. As a result, the other magnetic core 2 rotates about the support shaft 4. Thus, the two magnetic cores 1, 2 are brought into an opened state. In this case, since the basal portions of the two magnetic cores are each sandwiched between the actuating means, the leading ends of the two magnetic cores are prevented from producing play relative to each other.

When the trigger 15 is released from the pressure of the finger tip, the resiliency of the spring 12 causes the magnetic core 1 to rotate counterclockwise about the support shaft 3 and, consequently, the receiving piece 11 of the second actuating means 7 attached to the basal portion 1' presses down the actuating piece 9 of the first actuating means 6 attached to the basal portion 2' of the magnetic core 2, with the result that the magnetic core 2 is rotated in the direction of approaching the other magnetic core 1. Thus, the two magnetic cores are brought into a completely closed state.

Where the first actuating means 6 and the second actuating means 7 are fastened respectively to the magnetic cores 1, 2 each only on one side thereof, desired opening and closing of the magnetic cores are readily obtained by causing the magnetic core holding fast thereon the first actuating means 6 to be interlocked with the trigger so as to be moved synchronously therewith and allowing the magnetic core holding fast thereon the second actuating means 7 to be constantly energized by the spring 12 in the direction of bringing the two magnetic cores into a closed state as shown in FIG. 5.

It is clear from the foregoing description that in the ammeter of the construction according to this invention, when one of the two magnetic cores is moved in the opening direction, the remaining magnetic core is moved similarly in the opening direction because of the actuating means provided at the basal portions of the magnetic cores, and when the opening operation is freed, the two magnetic cores are moved backward into a closed state. Since the ammeter relies upon the actuating means for desired opening and closing of the magnetic cores, the operations of opening and closing proceed very smoothly owing to the absence of resistance. Further since the attachment of the actuating means to the basal portions pivotally joined to the magnetic cores is about the only manual work involved in the manufacture of the ammeter, the ammeter is very easy to manufacture and is suitable for mass production. Since the ammeter is only required to include a space for accommodating the spring, it allows ample reduction in size. When the ammeter is constructed so as to have the magnetic cores opened to a large aperture, the actuating means have an effect of preventing the magnetic cores from producing play. Thus, the ammeter can surely clamp an electric cable of a larger diameter.

What is claimed is:

1. A clamp type ammeter, comprising:
    a laterally symmetrical pair of magnetic cores each pivotally attached to a support shaft,
    first actuating means provided at a basal portion pivotally attached to the first of said pair of magnetic cores, said first actuating means possessing a fitting portion adapted to join the basal portion of the first magnetic core and an actuating piece protruding from one lateral lower side of the fitting portion,
    second actuating means provided at a basal portion pivotally attached to the second of said pair of magnetic cores, said second actuating means possessing a fitting portion adapted to join the basal portion of the second magnetic core and a receiving piece protruding from one lateral upper side of the fitting portion, said receiving piece of the second actuating means being underlaid by said actuating piece of the first actuating means,
    spring means adapted to produce an energizing force such as to keep said pair of magnetic cores in a closed state, and
    a trigger adapted to act upon said first magnetic core in the direction of bringing the pair of magnetic cores into an opened state.

2. The ammeter according to claim 1, wherein said spring means is adapted to energize the second magnetic core to the closed state.

3. The ammeter according to claim 1, wherein the first magnetic core is provided on one side of the basal portion thereof with the first actuating means and on the other side of the basal portion thereof with the second actuating means and the second magnetic core is provided on one side of the basal portion thereof with the second actuating means and on the other side of the basal portion thereof with the first actuating means respectively.

* * * * *